(12) United States Patent
Sonoda

(10) Patent No.: US 11,165,016 B2
(45) Date of Patent: Nov. 2, 2021

(54) MEMORY DEVICE AND METHOD OF MANUFACTURING THE SAME

(71) Applicant: TOSHIBA MEMORY CORPORATION, Tokyo (JP)

(72) Inventor: Yasuyuki Sonoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/563,986

(22) Filed: Sep. 9, 2019

(65) Prior Publication Data

US 2020/0313082 A1 Oct. 1, 2020

(30) Foreign Application Priority Data

Mar. 28, 2019 (JP) .............................. JP2019-064287

(51) Int. Cl.
*H01L 43/08* (2006.01)
*H01L 43/12* (2006.01)
*H01L 27/22* (2006.01)

(52) U.S. Cl.
CPC ............ *H01L 43/08* (2013.01); *H01L 27/222* (2013.01); *H01L 43/12* (2013.01)

(58) Field of Classification Search
CPC ........ H01L 43/08; H01L 43/12; H01L 27/222
See application file for complete search history.

(56) References Cited

U.S. PATENT DOCUMENTS

| 9,893,121 | B2 | 2/2018 | Sonoda et al. | |
|---|---|---|---|---|
| 9,991,442 | B2 | 6/2018 | Park | |
| 2008/0265347 | A1* | 10/2008 | Iwayama | H01L 43/08 257/421 |
| 2015/0311253 | A1* | 10/2015 | Choi | H01L 43/12 257/252 |
| 2015/0311429 | A1 | 10/2015 | Li et al. | |
| 2016/0049447 | A1 | 2/2016 | Jung et al. | |
| 2016/0163369 | A1 | 6/2016 | Lee et al. | |
| 2016/0336509 | A1 | 11/2016 | Jeong et al. | |
| 2017/0256705 | A1* | 9/2017 | Yoshikawa | H01L 43/12 |
| 2018/0205003 | A1 | 7/2018 | Bak | |

* cited by examiner

*Primary Examiner* — Herve-Louis Y Assouman
(74) *Attorney, Agent, or Firm* — Holtz, Holtz & Volek PC

(57) ABSTRACT

According to one embodiment, a method of manufacturing a memory device includes forming a first layer stack and a second layer stack at an interval on a foundation, and forming a first insulator that includes a first portion on a side surface of the first layer stack, a second portion on a side surface of the second layer stack, and a third portion on the foundation between the first and second layer stacks. Part of the first portion of the first insulator and part of the second portion are thinned with an ion beam while leaving the third portion of the first insulator. A second insulator is formed between the first and second portions of the first insulator.

11 Claims, 14 Drawing Sheets

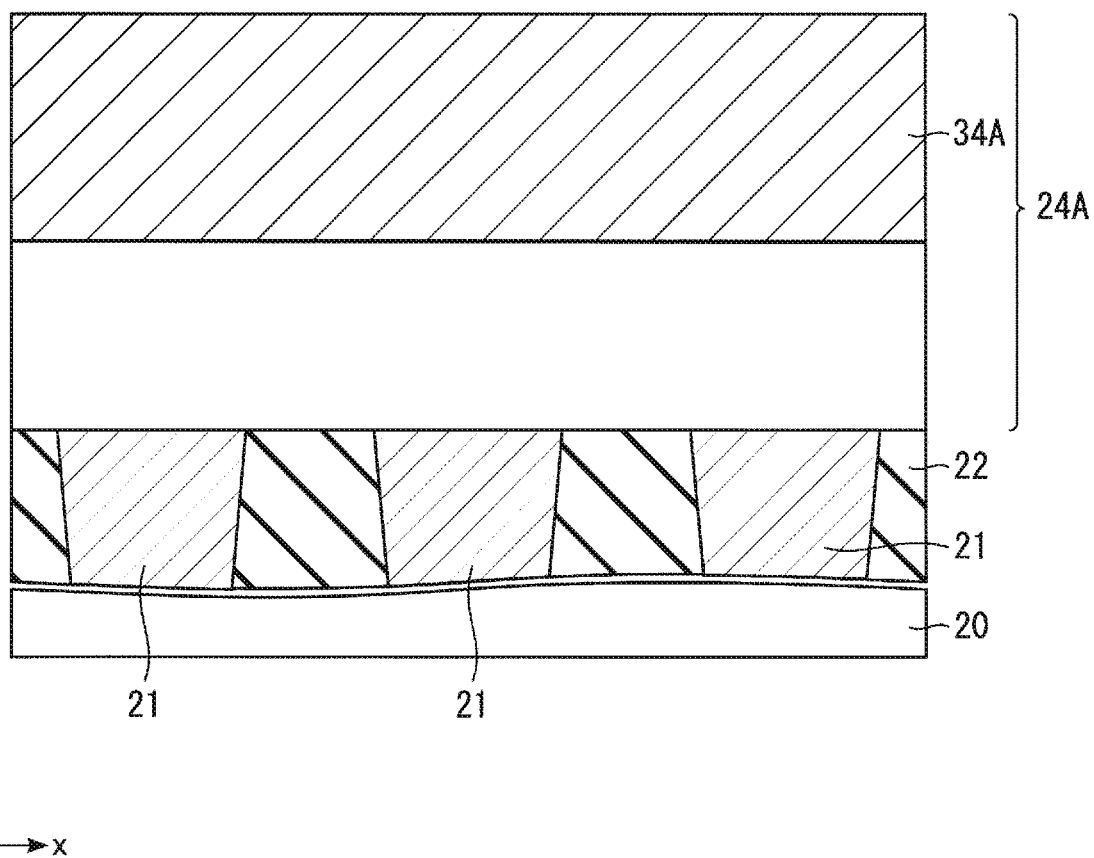
F I G. 5

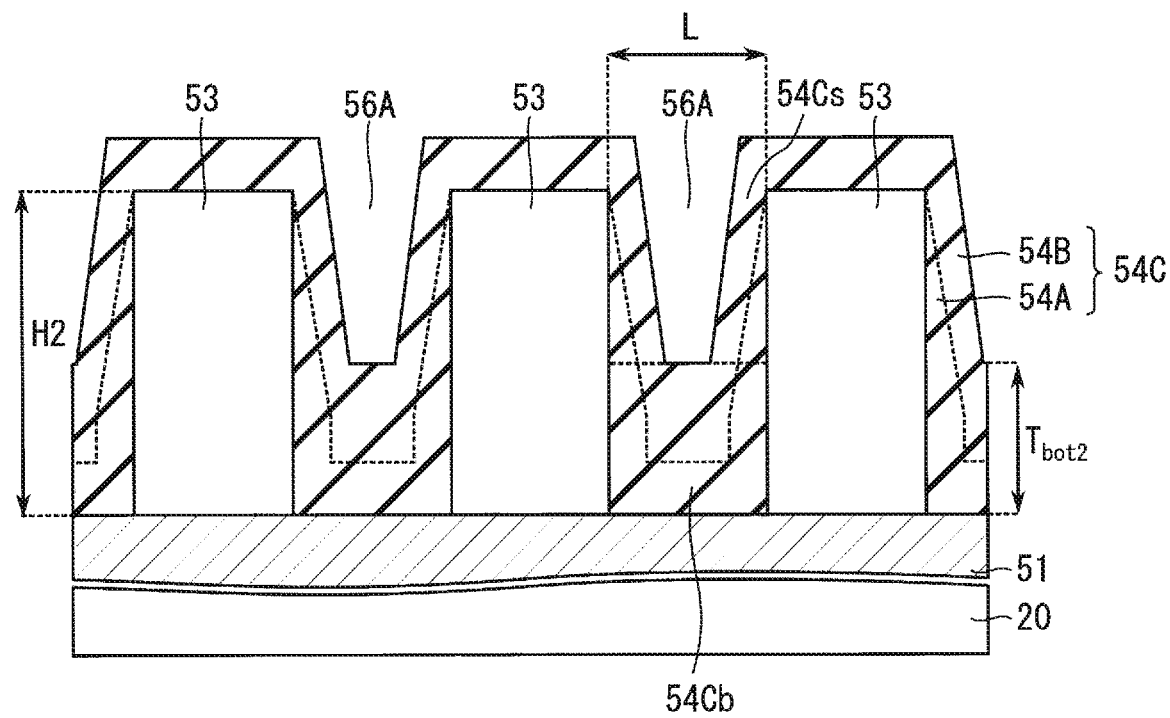
F I G. 18

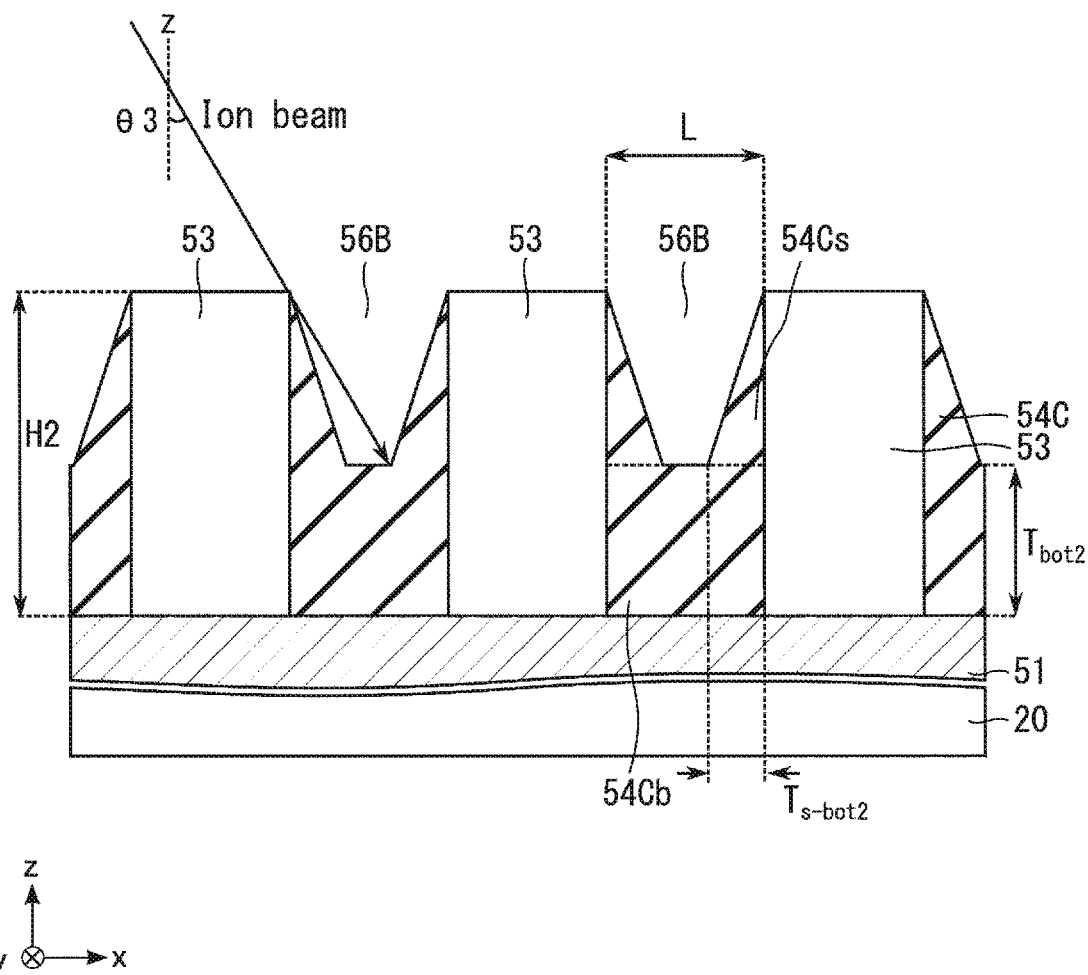
F I G. 19 ns is known.

MEMORY DEVICE AND METHOD OF MANUFACTURING THE SAME

CROSS-REFERENCE TO RELATED APPLICATIONS

This application is based upon and claims the benefit of priority from Japanese Patent Application No. 2019-64287, filed Mar. 28, 2019, the entire contents of which are incorporated herein by reference.

FIELD

Embodiments described herein relate generally to a memory device and a method of manufacturing the same.

BACKGROUND

A memory device using a magnetoresistive effect elements is known.

BRIEF DESCRIPTION OF THE DRAWINGS

FIG. 5 shows a state of part of the memory device according to the first embodiment during its manufacturing process.

FIG. 18 shows a state subsequent to the state shown in FIG. 17.

FIG. 19 shows a state subsequent to the state shown in FIG. 18.

DETAILED DESCRIPTION

Figure 1:
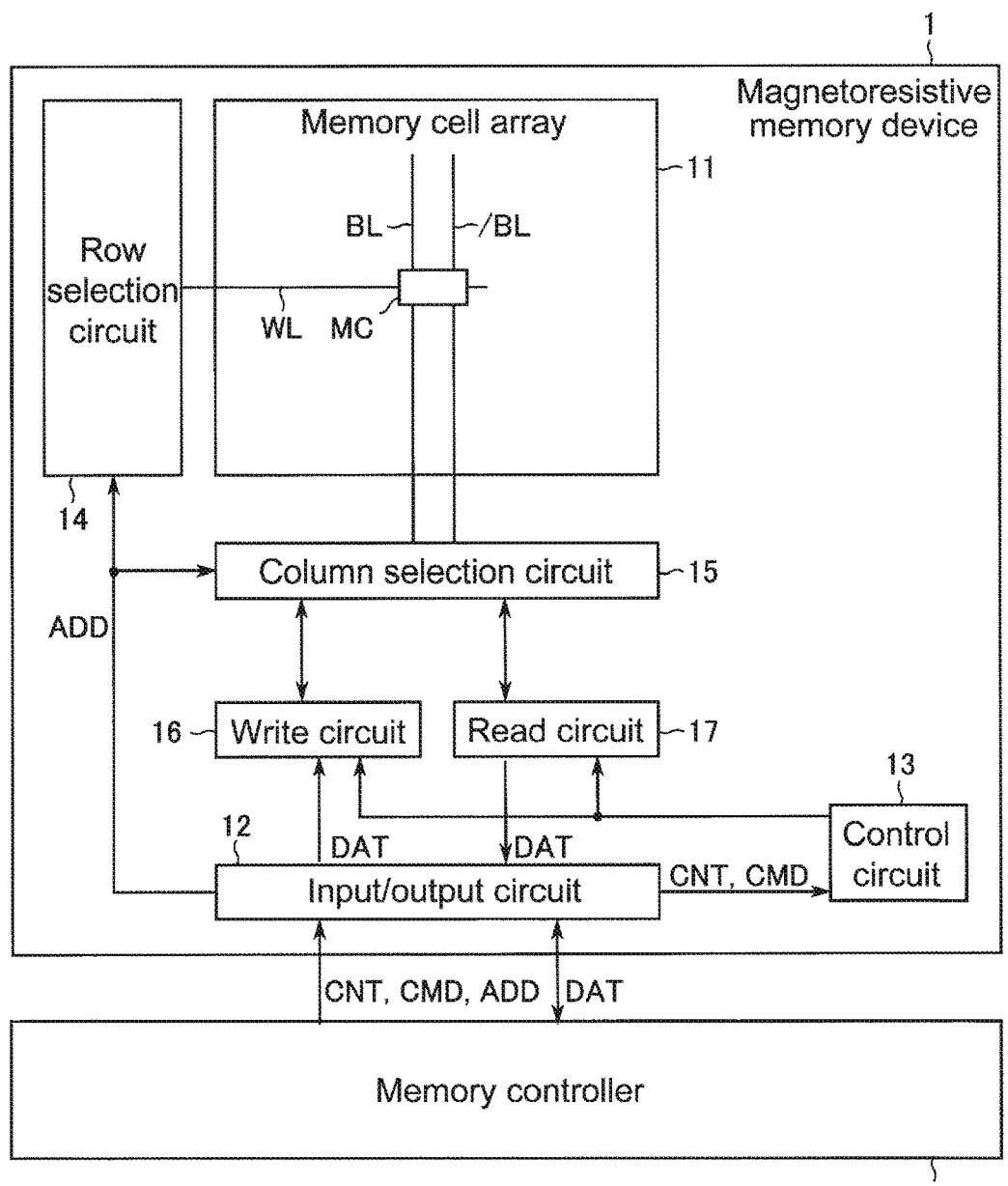
FIG. 1 is a functional block diagram showing a memory device according to a first embodiment.

According to one embodiment, a method of manufacturing a memory device includes forming a first layer stack and a second layer stack at an interval on a foundation, and forming a first insulator that includes a first portion on a side surface of the first layer stack, a second portion on a side surface of the second layer stack, and a third portion on the foundation between the first layer stack and the second layer stack. Part of the first portion of the first insulator and part of the second portion are thinned with an ion beam while leaving the third portion of the first insulator. A second insulator is formed between the first portion of the first insulator and the second portion of the first insulator.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones.

The entire description for a particular embodiment also applies to another embodiment unless it is explicitly mentioned otherwise or obviously eliminated. Each embodiment illustrates the device and method for materializing the technical idea of that embodiment, and the technical idea of an embodiment does not specify the quality of the material, shape, structure, arrangement of components, etc. to the following.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

1.1. Configuration (Structure)

FIG. 1 is a functional block diagram showing a memory device according to a first embodiment. As shown in FIG. 1, a memory device 1 includes a memory cell array 11, an input/output circuit 12, a control circuit 13, a row selection circuit 14, a column selection circuit 15, a write circuit 16, and a read circuit 17.

The memory cell array 11 includes a plurality of memory cells MC, a plurality of word lines WL, and a plurality of bit lines BL and /BL. One bit line EL and one bit line /BL form one pair of bit lines. The memory cells MC is capable of storing data in a non-volatile manner. Each of the memory cells MC is coupled to one word line WL and one pair of bit lines BL and /BL. The word lines WL are associated with rows, respectively. The pairs of bit lines BL and /BL are associated with columns, respectively. One or more memory cells MC are specified by selecting one row and one or more columns.

The input/output circuit 12 receives various control signals CNT, various commands CMD, an address signal ADD, and data (write data) DAT from a memory controller 2, for example, and transmits data (read data) DAT to the memory controller 2, for example.

The row selection circuit 14 receives an address signal ADD from the input/output circuit 12, and sets one word line WL corresponding to a row selected based on the received address signal ADD, to a selected state.

The column selection circuit 15 receives an address signal ADD from the input/output circuit 12, and sets the plurality of bit lines BL corresponding to a column selected based on the received address ADD, to a selected state.

The control circuit 13 receives a control signal CNT and a command CMD from the input/output circuit 12. The control circuit 13 controls the write circuit 16 and the read circuit 17 based on control indicated by the control signal CNT and the command CMD. Specifically, the control circuit 13 supplies the write circuit 16 with voltages used in data writing while data is written to the memory cell array 11. The control circuit 13 supplies the read circuit 17 with voltages used in data reading while data is read from the memory cell array 11.

The write circuit 16 receives write data DAT from the input/output circuit 12, and supplies the column selection circuit 15 with voltages used in data writing based on control by the control circuit 13 and the write data DAT.

The read circuit 17 includes a sense amplifier and determines data stored in memory cells MC by using the voltages for data writing, based on control by the control circuit 13. The determined data is supplied as read data DAT to the input/output circuit 12.

Figure 2:
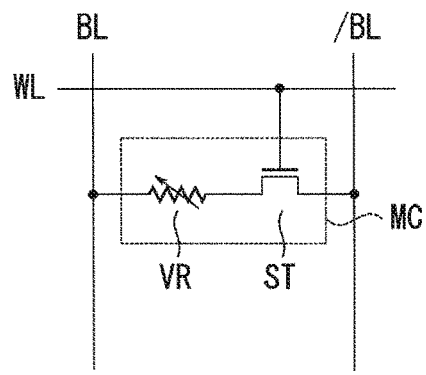
FIG. 2 is a circuit diagram of one memory cell according to the first embodiment.

FIG. 2 is a circuit diagram of one memory cell MC according to the first embodiment. Each of the memory cells MC includes a variable resistance element VR and a select transistor ST. In a steady state, the resistance change element VR is in a selected one of two resistance states. One of the two resistance states is higher in resistance than the other. The variable resistance element VR is switchable between a low-resistance state and a high-resistance state, and is capable of storing one-bit data by utilizing a difference between the two resistance states. The variable resistance element VR exhibits, for example, a magnetoresistive effect, and includes, for example, a magnetic tunnel junction (MTJ) element. The MTJ element means a structure including an MTJ.

The select transistor ST can be an n-type metal oxide semiconductor field effect transistor (MOSFET).

The variable resistance element VR has a first end coupled to one bit line BL, and a second end coupled to a first end of the select transistor ST. The select transistor ST has a second end coupled to the bit line /BL. The select transistor ST has a gate coupled to one word line WL, and a source coupled to the bit line /BL.

The following description is based on the example in which the variable resistance element VR includes the MTJ element.

Figure 3:
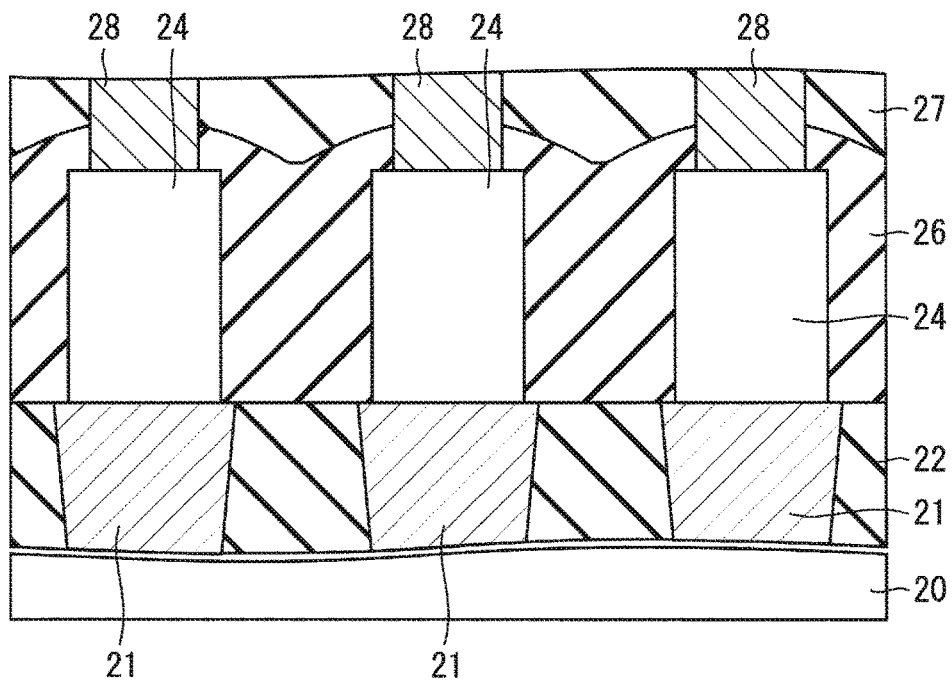
FIG. 3 shows a partial structure of a memory cell array according to the first embodiment.

FIG. 3 shows a partial structure of the memory cell array 11 according to the first embodiment. More specifically, FIG. 3 shows respective variable resistance elements VR of some memory cells MC and their periphery.

Independent lower electrodes 21 are formed above a substrate 20. An inter-layer insulator 22 is provided in areas between the lower electrodes 21. For example, the inter-layer insulator 22 fills the areas between the lower electrodes 21. The lower electrodes 21 and the inter-layer insulator 22 function as a foundation for layers above themselves.

One layer stack 24 is formed on the upper surface of each of the lower electrodes 21. Each of the layer stacks 24 includes stacked layers and at least includes layers constituting a variable resistance element VR, for example, layers constituting an MTJ element.

An inter-layer insulator 26 is provided in areas between the layer stacks 24. The inter-layer insulator 26 fills, for example, the areas between the layer stacks 24, and, for example, are provided up to a position higher than the upper surfaces of the layer stacks 24. The inter-layer insulator 26 includes or consists of silicon oxide (SiO), silicon nitride (SiN), aluminum nitride (AlN), or hafnium nitride (HfN). The inter-layer insulator 26 may include more than one of those materials.

An upper electrode 28 is formed on the upper surface of each of the layer stacks 24. The areas on the upper surface of the inter-layer insulator 26 and free from the upper electrodes 28 are provided with an inter-layer insulator 27.

Figure 4:
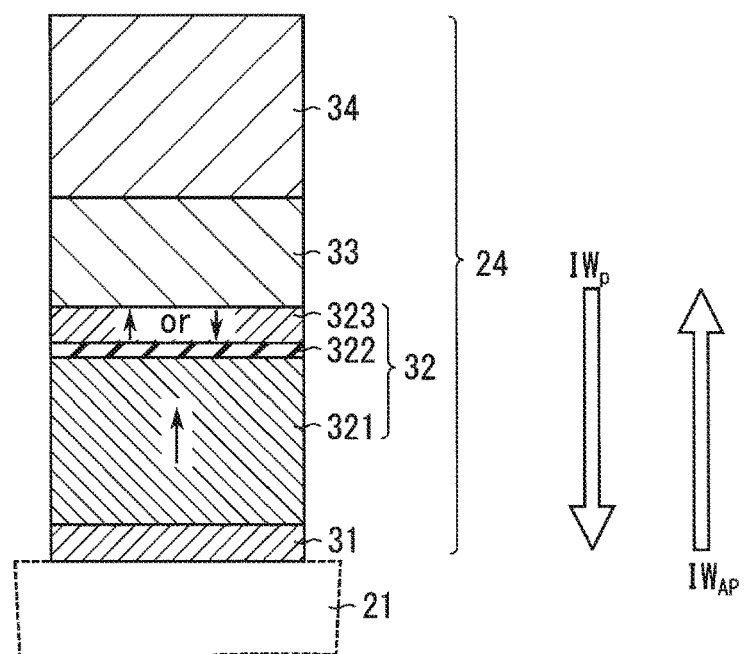
FIG. 4 shows an example of a layer stack and a magnetization state according to the first embodiment.

FIG. 4 shows an example of the layer stacks 24 according to the first embodiment. As shown in FIG. 4, each of the layer stacks 24 includes, for example, a buffer layer 31, an MTJ element 32, a cap layer 33, and a hard mask 34. The buffer layer 31 is positioned on the upper surface of a lower electrode 21.

The buffer layer 31 includes one or more of Al, Be, Mg, Ca, Sr, Ba, Sc, Y, La, Si, Zr, Hf, W, Cr, Mo, Nb, Ti, Ta, and V. The buffer layer 31 may include a boride of one or more of those materials.

The MTJ element 32 is positioned on the upper surface of the buffer layer 31. The MTJ element 32 includes a magnetic tunnel junction and exhibits a magnetoresistive effect. As an example of such an MTJ element 32, the MTJ element 32 includes a ferromagnet 321, an insulator 322, and a ferromagnet 323.

The ferromagnet 321 is positioned on the upper surface of the buffer layer 31, and includes one or more of, for example, cobalt platinum (CoPt), cobalt nickel (CoNi), and cobalt palladium (CoPd), or consists of any one of CoPt, CoNi, and CoPd.

The insulator 322 is positioned on the upper surface of the ferromagnet 321. The insulator 322 includes or consists of nonmagnetic insulator. For example, the insulator 322 includes or consists of magnesium oxide (MgO) or aluminum oxide (AlO). The insulator 322 may include a nitride of an element such as aluminum (Al), silicon (Si), beryllium (Be), magnesium (Mg), calcium (Ca), strontium (Sr), barium (Ba), scandium (Sc), yttrium (Y), lanthanum (La), zirconium (Zr), or hafnium (Hf).

The ferromagnet 323 is positioned on the upper surface of the insulator 322, and includes one or more of cobalt-iron-boron (CoFeB) and iron boron (FeB) or consists of either one of CoFeB and FeB.

The ferromagnet 321 and the ferromagnet 323 may be swapped with each other.

The ferromagnets 321 and 323 have magnetization, and have, for example, magnetization easy axes (indicated by the arrows) that are perpendicular to the interfaces of the ferromagnet 321, the insulator 322, and the ferromagnet 323. The ferromagnets 321 and 323 may have magnetization easy axes that extend along the interfaces of the ferromagnet 321, the insulator 322, and the ferromagnet 323.

The magnetization direction of the ferromagnet 321 remains unchanged even by a normal operation in the memory device 1, that is, by data reading and writing. Thus, the ferromagnet 321 can function as a so-called reference layer. On the other hand, the magnetization direction of the ferromagnet 323 is variable. Thus, the ferromagnet 321 can function as a so-called storage layer. The insulator 322 can function as a tunnel barrier.

Specifically, the MTJ element 32 exhibits resistance value Rp when the magnetization directions of the ferromagnets 321 and 323 are parallel to each other. On the other hand, the MTJ element 32 exhibits resistance value Rap when the magnetization directions of the ferromagnets 321 and 323 are antiparallel to each other. Resistance value Rap is larger than resistance value Rp. The states that show two different resistance values may be respectively assigned to two types of data of one bit.

When write current $Iw_P$ flows from the ferromagnet 323 toward the ferromagnet 321, the magnetization direction of the ferromagnet 323 becomes parallel to the magnetization direction of the ferromagnet 321. On the other hand, when write current $Iw_{AP}$ flows from the ferromagnet 321 toward the ferromagnet 323, the magnetization direction of the ferromagnet 323 becomes antiparallel to the magnetization direction of the ferromagnet 321.

The cap layer 33 is positioned on the upper surface of the MTJ element 32. The cap layer 33 is, for example, a metal layer, and includes at least one of tantalum (Ta), ruthenium (Ru), platinum (Pt), and tungsten (W), for example.

The hard mask 34 is positioned on the upper surface of the cap layer 33. The hard mask 34 is a metal layer.

The layer stack 24 may further include a conductor. Such a conductor includes a foundation layer between the lower electrodes 21 and the buffer layer 31.

1.2. Manufacturing Method

A method of manufacturing a structure shown in FIG. 3 will be described with reference to FIGS. 1 and 5 to 9. FIGS. 5 to 9 sequentially show states of the portion shown in FIG. 3 of the memory device 1 according to the first embodiment during its manufacturing process.

As shown in FIG. 5, the inter-layer insulator 22 and the lower electrodes 21 are formed above the surface extending along the xy plane of the substrate 20. A layer stack 24A is formed on the upper surfaces of the inter-layer insulator 22 and each of the lower electrodes 21. The layer stack 24A is later processed into the layer stacks 24, and includes the same materials as those included in the layer stack 24. According to the example shown in FIG. 4, the layer stack 24A includes a buffer layer 31A, a ferromagnet 321A, an insulator 322A, a ferromagnet 323A, a cap layer 33A, and a hard mask 34A. The buffer layer 31A, the ferromagnet 321A, the insulator 322A, the ferromagnet 323A, the cap layer 33A, and the hard mask 34A include the same materials as those of the buffer layer 31, the ferromagnet 321, the insulator 322, the ferromagnet 323, the cap layer 33, and the hard mask 34, respectively.

Figure 6:
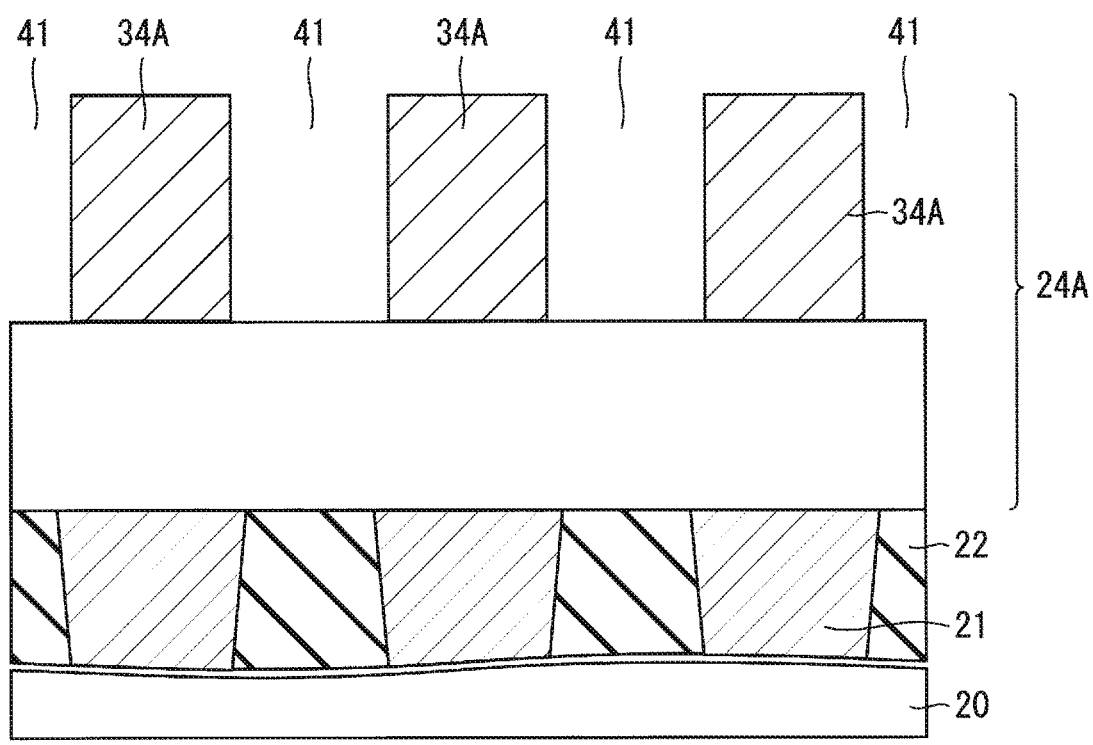
FIG. 6 shows a state subsequent to the state shown in FIG. 5.
Figure 6:
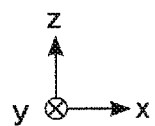

As shown in FIG. 6, openings 41 are formed in the hard mask 34A. The hard mask 34A remains in portions above areas in which the layer stacks 24 are to be formed, and includes the openings 41 in the remaining portions. The openings 41 extend from the upper surface to the bottom surface of the hard mask 34A.

Figure 7:
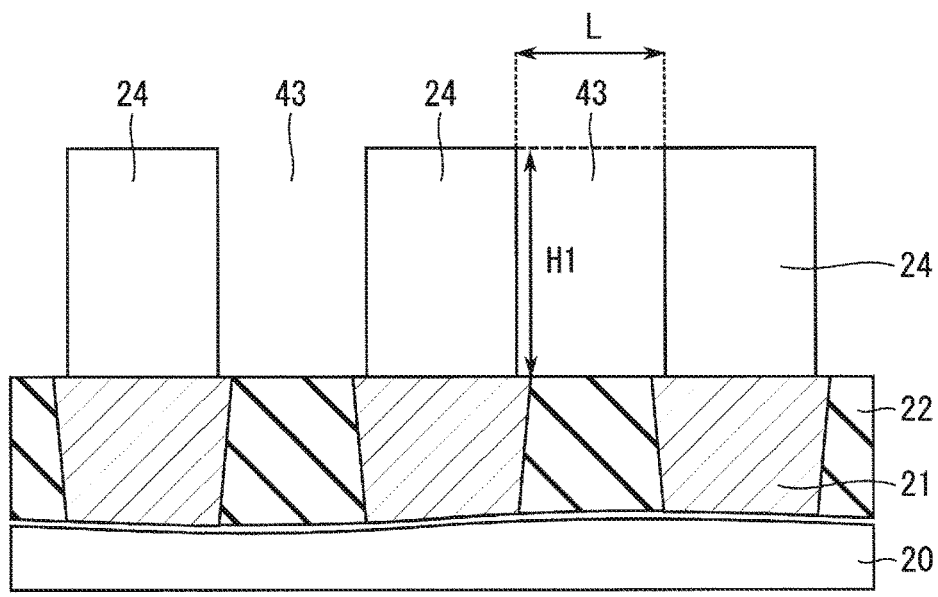
FIG. 7 shows a state subsequent to the state shown in FIG. 6.

As shown in FIG. 7, the structure obtained by the process described so far is etched using the hard mask 34A as a mask. As a result, portions of the layer stack 24A, which are located below the hard mask 34A, are processed to form the layer stacks 24. Etching shown in FIG. 7 may be any etching suitable for the formation of the layer stacks 24, such as ion beam etching (IBE) and/or reactive ion etching (RIE), for example. IBE may be performed using an ion such as argon (Ar), xenon (Xe), krypton (Kr), or neon (Ne). Etching shown in FIG. 7 lowers the upper surface of the hard mask 34A. Each area between adjacent two layer stacks 24 are referred to as an inter-layer-stack area 43. The upper ends of the inter-layer-stack areas 43 are the same in height as the upper surfaces of the layer stacks 24.

At the stage shown in FIG. 7, each of the inter-layer stack areas 43 has an aspect ratio in excess of 1. Specifically, assuming that each of the inter-layer-stack areas 43 has width L and height H1, H1/L>1 is established. Width L may be measured at any height of the inter-layer-stack areas 43. Height H1 corresponds to the height of the layer stacks 24.

Figure 8:
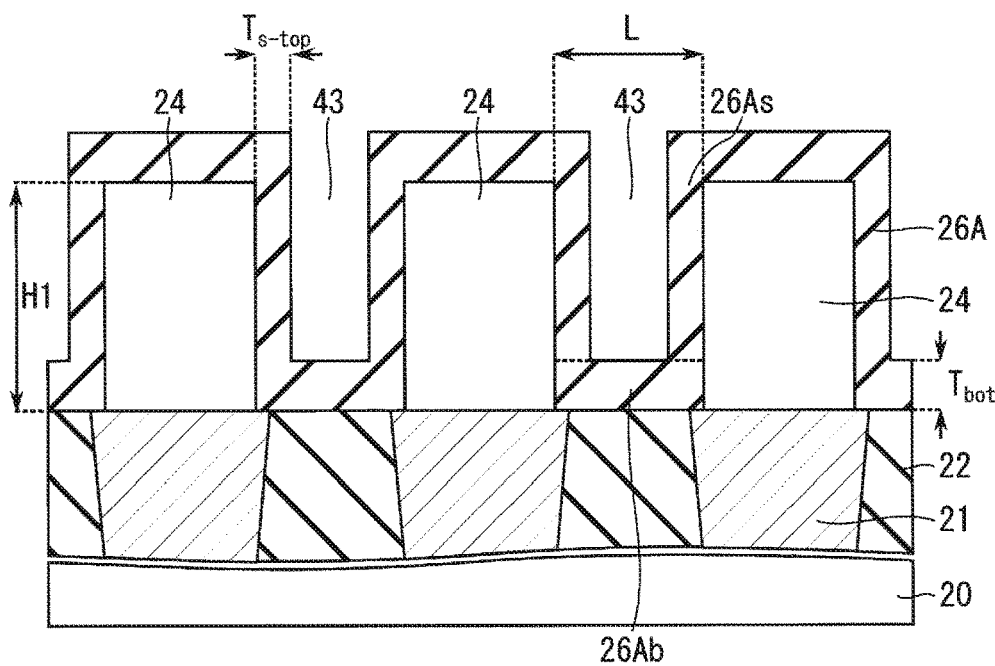
FIG. 8 shows a state subsequent to the state shown in FIG. 7.

As shown in FIG. 8, an insulator 26A is deposited on the whole upper surface of the structure obtained by the process described so far. The insulator 26A is formed by, for example, chemical vapor deposition (CVD), constitutes part of the inter-layer insulator 26, and includes one or more of SiO, SiN, AlN, and HfN, as does the inter-layer insulator 26, for example. The insulator 26A covers the surfaces (the upper surface and side surfaces) of the layer stacks 24 and the upper surfaces of the inter-layer insulator 22 within the inter-layer-stack areas 43. The insulator 26A contains portions located on the upper surface of the inter-layer insulator 22, and these portions may be referred to as bottoms 26Ab. The insulator 26A contains portions located on the side surfaces of the layer stacks 24, and these portions may be referred to as side wall tops 26As. The bottoms 26Ab of the insulator 26A have thickness $T_{bot}$. The side wall tops 26As of the insulator 26A have thickness $T_{s\text{-}top}$. Thickness $T_{bot}$ is different from thickness $T_{s\text{-}top}$. In the insulator 26A, thickness $T_{s\text{-}top}$ is ⅓ or lower of width L of the inter-layer-stack areas 43. For example, thickness $T_{s\text{-}top}$ is ¼ of width L.

Figure 9:
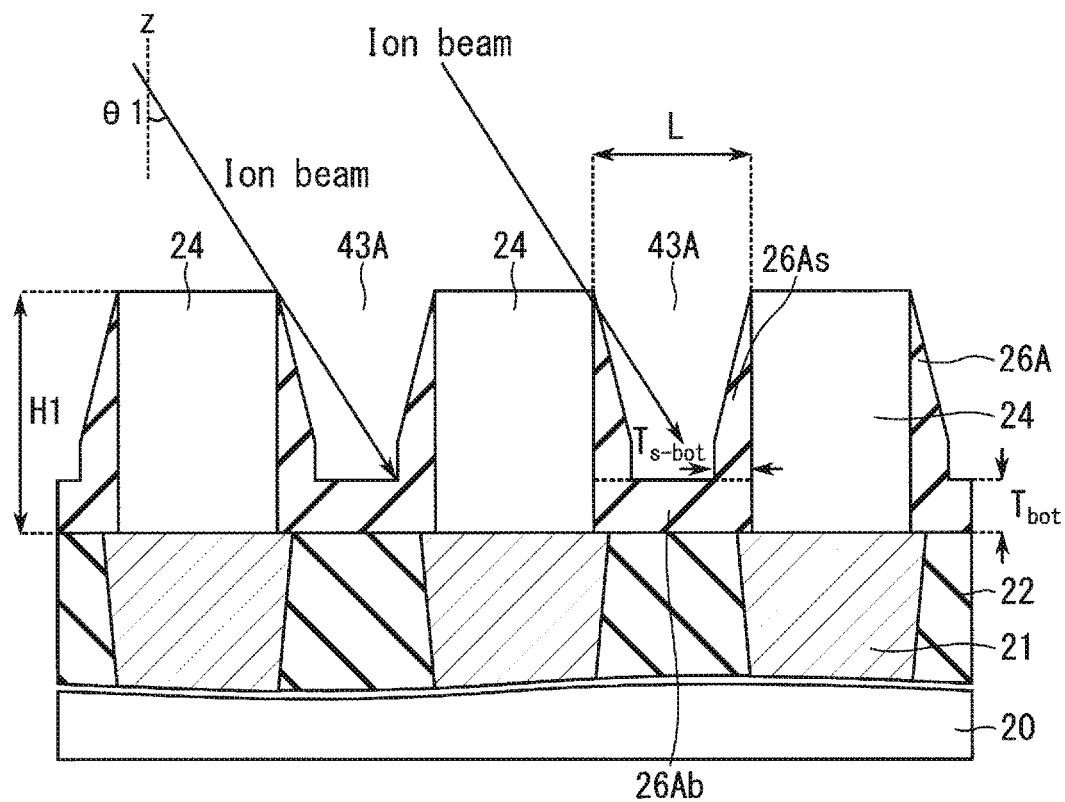
FIG. 9 shows a state subsequent to the state shown in FIG. 8.

As shown in FIG. 9, the insulator 26A is partially removed by IBE. In the same way as IBE shown in FIG. 7, IBE can be performed using an ion such as Ar, Xe, Kr, or Ne. Angle θ1 of the ion beam satisfies the condition described as the following equation (1).

$$\theta 1 = \tan^{-1}\left(\frac{L - 2T_{s\text{-}bot}}{H1 - T_{bot}}\right) \quad (1)$$

Angle θ1 is an angle relative to the z axis, while thickness $T_{s\text{-}bot}$ is a thickness of the side wall tops 26As of the insulator 26A, in particular, a thickness of the bottom portions of the side wall tops 26As. More specifically, thickness $T_{s\text{-}bot}$ may be a thickness of the side wall tops 26As of the insulator 26A, at the same height as the upper surfaces of the bottoms 26Ab of the insulator 26A, for example.

The ion beam removes portions of the insulator 26A, which are located on the upper surfaces of the layer stacks 24. Part of the ion beam travels through the inter-layer-stack areas 43, and partially removes the upper portions of the side wall tops 26As of the insulator 26A. As a result, each of the side wall tops 26As of the insulator 26A becomes thinner in its upper portion on the side surfaces of each of the layer stacks 24 and tapered.

On the other hand, etching with ion beam at angle θ1 produces the shadow effect. That is, another part of the ion beam is blocked by the layer stacks 24. Therefore, the ion beam does not reach or hardly reaches the bottom portions of the inter-layer-stack areas 43. As a result, the bottoms of the side wall tops 26As of the insulator 26A maintain, for example, their original thickness (i.e., before IBE shown in FIG. 9), and this thickness is $T_{s\text{-}bot}$, for example. The bottoms 26Ab of the insulator 26A also maintain their original thickness $T_{bot}$.

The inter-layer-stack areas 43 obtained as a result of the process in FIG. 9 contain areas free from the insulator 26A. Such areas are referred to as inter-layer-stack areas 43A. The inter-layer-stack areas 43A are smaller in volume than the inter-layer-stack areas 43 having height H1 and width L at the stage shown in. FIG. 7. In particular, since the insulator 26A with thickness $T_{bot}$ remains in the bottoms of the inter-layer-stack areas 43, the inter-layer-stack areas 43A are smaller in aspect ratio than the inter-layer-stack areas 43. Furthermore, a width of the upper ends of the inter-layer-stack areas 43A, that is, an interval (width) between edges of the upper surfaces of adjacent layer stacks 24 is larger than an interval (width) shown in FIG. 8. The upper ends of the inter-layer-stack areas 43A have, for example, the same width L as in FIG. 7.

Figure 10:
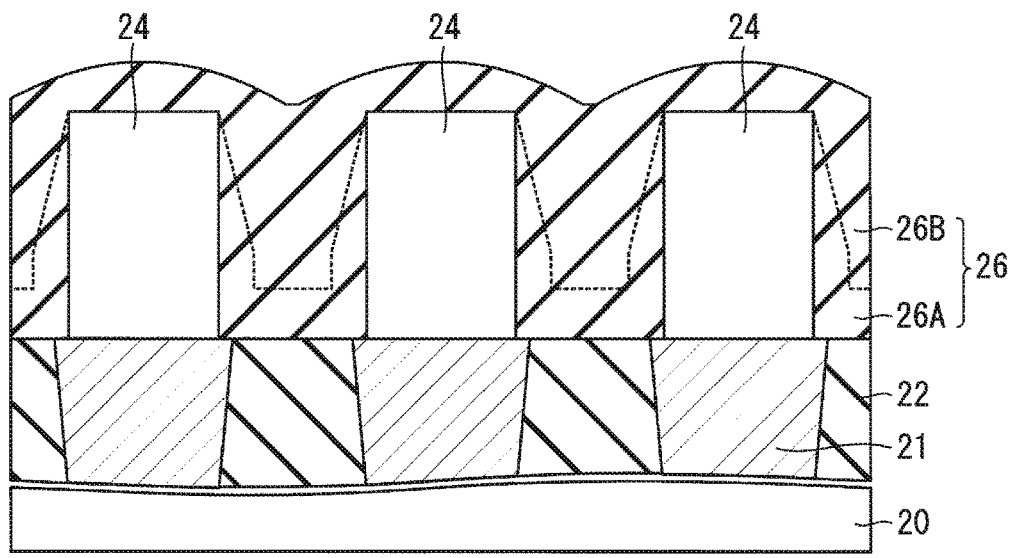
FIG. 10 shows a state subsequent to the state shown in FIG. 9.

As shown in FIG. 10, an insulator 26B is deposited on the whole upper surface of the structure obtained by the process described so far. The insulator 26B constitutes part of the inter-layer insulator 26 and includes one or more of SiO, SiN, AlN, and HfN, as in the inter-layer insulator 26, for example. The insulator 26B may be equal to or different from the insulator 26A in terms of property and/or composition.

As shown in FIG. 3, the inter-layer insulator 27 is formed on the upper surface of the inter-layer insulator 26, and the upper electrodes 28 are formed.

1.3. Advantages

The first embodiment can provide a memory device increased in density and performance. The details will be described below.

A layer stack including an MTJ element, such as the layer stacks 24 according to the first embodiment, needs to have a certain height that is determined based on requirements for exhibiting functions as a memory cell MC, manufacturing conditions, etc. On the other hand, to improve a memory device in integration degree, a smaller interval is desired for the layer stacks 24. This increases an aspect ratio of the inter-layer-stack areas 43. Therefore, a desired structure may not be realized by the existing manufacturing method. For example, when the insulator 26A is formed through the process shown in FIG. 8 of the memory device according to the first embodiment, a small width of the inter-layer-stack areas 43 may cause two side wall tops 26As of the insulator 26A, which are facing within an inter-layer-stack area 43, to come in contact with each other, thereby leaving a void in this inter-layer-stack areas 43. The presence of a void may degrade a property of the memory device 1 (for example, a memory cell MC) due to the influence on the subsequent manufacturing process. On the other hand, if the insulator 26A is thin in order to avoid the formation of a void, another problem will arise.

Figure 11:
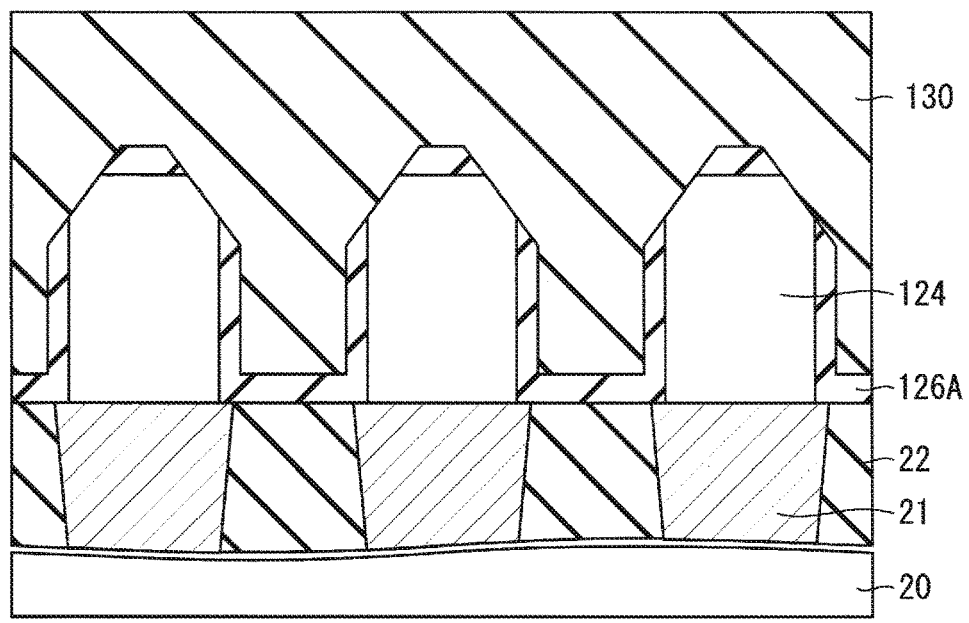
FIG. 11 shows one state of a reference memory device during its manufacturing process.

FIG. 11 shows one state during a process of manufacturing a reference magnetoresistive memory device. FIG. 11 corresponds to a state of the magnetoresistive memory device according to the first embodiment after the state shown in FIG. 7. However, in FIG. 11, an insulator 126A is thinner than the insulator 26A in FIG. 8. After the insulator 126A is formed by the same process as in FIG. 8, the upper surface of the insulator 126A is covered with an inter-layer insulator 130. In order to fill a narrow space between the layer stacks 24 with the inter-layer insulator 130, the inter-layer insulator 130 is formed by CVD in an atmosphere of high density plasma (HDP), or HDP-CVD. However, it is found that using the HDP-CVD removes portions of the insulator 126A and the layer stacks 24 are unintentionally. For example, portions around the upper corners of the layer stacks 24 are unintentionally cut by using HDP-CVD. This may result at least from the a thin insulator 126A. Such a structure deteriorates the layer stacks 24 and eventually the memory cells MC.

According to the first embodiment, after the insulator 26A is deposited on the surfaces of the layer stacks 24, the bottoms 26Ab of the insulator 26A are maintained while the side wall tops 26As are partially etched utilizing a shadow effect by IBE. Therefore, the inter-layer-stack areas 43A are smaller in aspect ratio than at least the inter-layer-stack areas 43. Accordingly, the inter-layer-stack areas 43A are easily filled with the insulator 26B. Furthermore, because of the partial etching performed on the insulator 26A, the upper ends of the inter-layer-stack areas 43 increase in width. This also facilitates filling of the insulator 26B in the inter-layer-stack areas 43A. Therefore, the inter-layer insulator 26 can be formed between the layer stacks 24 while preventing a void from forming in the inter-layer-stack areas 43A.

Since the inter-layer-stack areas 43A are easily filled with the insulator 26B, filling of the insulator 26B does not require usage of HDP-CVD. This prevents the layer stacks 24 from being unintentionally etched by HDP-CVD.

Second Embodiment

2.1. Configuration (Structure)

The second embodiment is different from the first embodiment in terms of a shape of the layer stacks 24 and a manufacturing process. The description of the second embodiment will focus mainly on the points that differ from the first embodiment. Other than what is described below, the second embodiment is the same as the first embodiment.

The memory device 1 according to the second embodiment includes layer stacks 53 in place of the layer stacks 24 in the first embodiment. The layer stacks 53 are higher in height than the layer stacks 24. The structure including the layer stacks 53 is so configured due to various reasons; however, the second embodiment is not limited by the details of the layer stacks 53. The following description is based on one example of the layer stacks 53.

Figure 12:
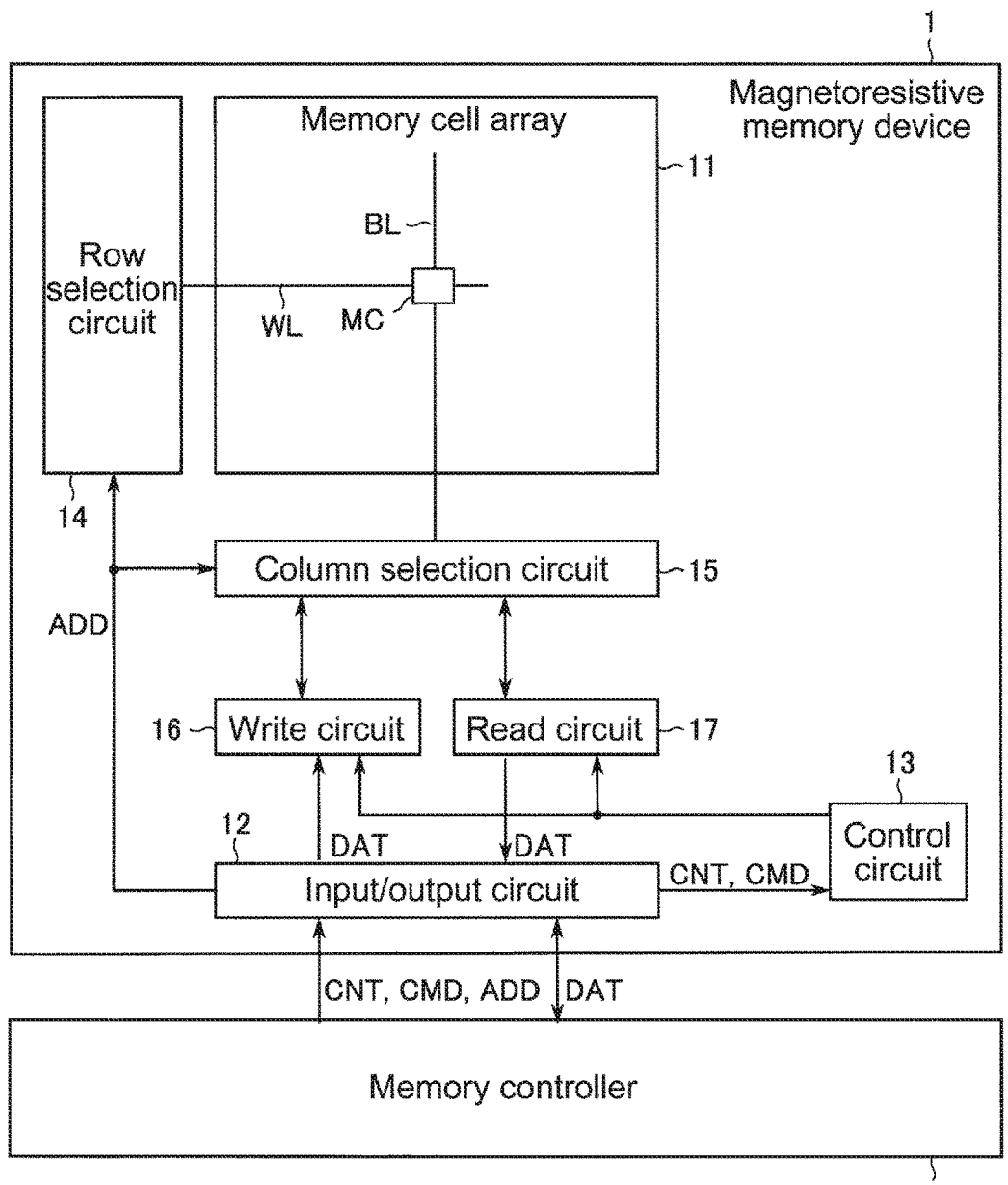
FIG. 12 is a functional block diagram showing a memory device according to a second embodiment.

FIG. 12 is a functional block diagram showing the memory device 1 according to the second embodiment. Each of the memory cells MC is coupled to one word line WL and one bit line BL.

Figure 13:
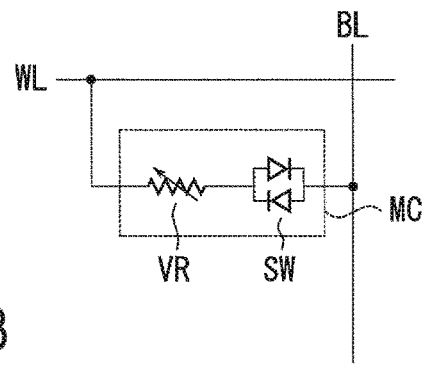
FIG. 13 is circuit diagram of one memory cell according to the second embodiment.

FIG. 13 is a circuit diagram of one memory cell MC according to the second embodiment. Each of the memory cells MC includes a variable resistance element VR and a switching element SW. The switching element SW includes two terminals. When a voltage smaller than a first threshold is applied in the first direction between the two terminals of switching element SW, the switching element SW is in a high-resistance state, or, for example, an electrically non-conductive state (OFF state). On the other hand, when a voltage equal to or larger than the first threshold is applied in the first direction between the two terminals, the switching element SW is in a low-residence state, or, for example, an electrically conductive state (ON state). With respect to the second direction opposite to the first direction, the switching element SW has the same function, that is, the function to switch between a high-resistance state and a low-resistance state based on a value of voltage applied in the first direction. Whether or not to supply a voltage to a variable resistance element VR coupled to a switching element SW, that is, whether or not to select this coupled variable resistance element VR, can be controlled by turning on or off this switching element SW.

Figure 14:
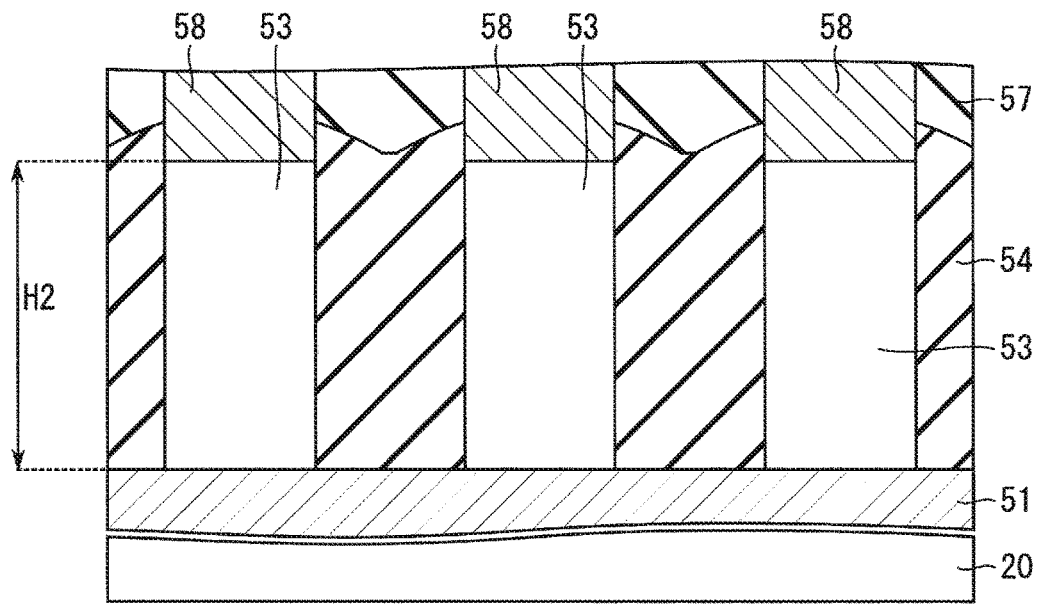
FIG. 14 shows a partial structure of a memory cell array according to the second embodiment.

FIG. 14 shows a partial structure of the memory cell array 11 according to the second embodiment. More specifically, FIG. 14 shows respective variable resistance elements VR of some memory cells MC and their periphery.

A conductor 51 is formed above the substrate 20. The conductor 51 extends along the x axis, and can function as one of the word line WL and the bit line BL. The conductor 51 can function as a foundation for layers above itself.

Layer stacks 53 are formed on the upper surface of the conductor 51. The layer stacks 53 have height H2. Height H2 is larger than height H1 of the layer stacks 24 in the first embodiment. Each of the layer stacks 53 includes stacked layers and includes at least the variable resistance element VR such as an MTJ element, and the switching element SW.

An inter-layer insulator 54 is provided in areas between the layer stacks 53. The inter-layer insulator 54 fills, for example, the areas between the layer stacks 53. The inter-layer insulator 54 includes or consists of SiO, SiN, AlN, or HfN. The inter-layer insulator 54 may include more than one of such materials.

A conductor 58 is formed on the upper surfaces of each of the layer stacks 53. Each of the conductors 58 can function as the other of the word line WL and the bit line BL. The areas on the upper surfaces of the inter-layer insulator 54 and free from the conductors are provided with an inter-layer insulator 57.

Figure 15:
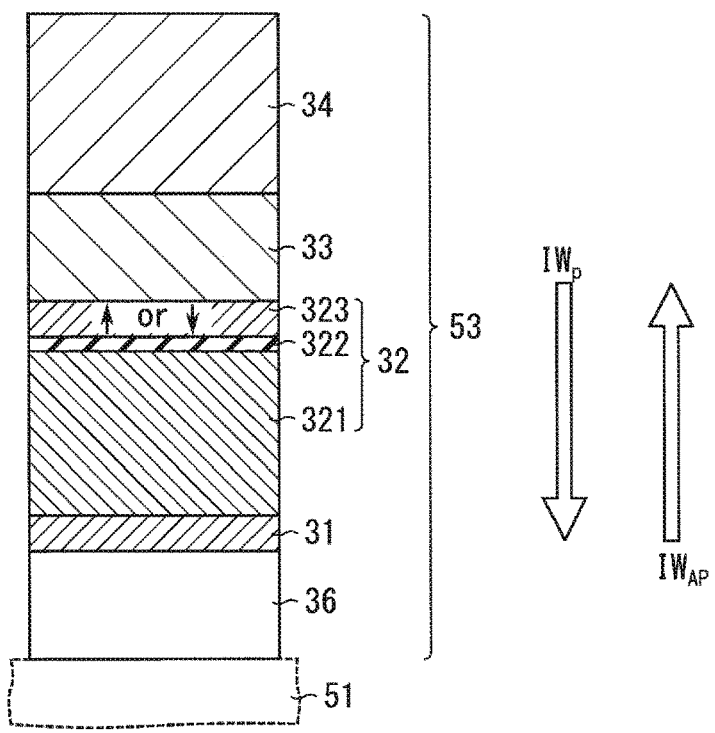
FIG. 15 shows an example of a layer stack and a magnetization state according to the second embodiment.

FIG. 15 shows an example of the layer stacks 53 according to the second embodiment. As shown in FIG. 15, each of the layer stacks 53 includes, for example, the buffer layer 31, the MTJ element 32, the cap layer 33, and the hard mask 34 as in the first embodiment, and further includes a variable resistance material 36. The variable resistance material 36 is positioned between, for example, the conductor 51 and the buffer layer 31. Each of the variable resistance materials 36 can function as a switching element SW.

The variable resistance material 36 is, for example, a switching element between two terminals. A first terminal of the two terminals corresponds to one of the upper surface and the bottom surface of the variable resistance material 36. A second terminal of the two terminals corresponds to the other of the upper and bottom surfaces of the variable resistance material 36. As one example, the variable resistance material 36 may include at least a chalcogen element selected from a group of tellurium (Te), selenium (Se), and sulfur (S). As an alternative example, the variable resistance material 36 may include, for example, chalcogenide, which is a compound containing the aforementioned chalcogen element. This variable resistance material 36 may include at least one element selected from a group of boron (B), Al, gallium (Ga), indium (In), carbon (C), Si, germanium (Ge), tin (Sn), arsenic (As), phosphorus (P), and antimony (Sb).

2.2. Manufacturing Method

A method of manufacturing the structure shown in FIG. 14 will be described with reference to FIGS. 14 and 16 to 20. FIGS. 16 to 20 sequentially show states of the portion shown in FIG. 14 of the memory device 1 according to the second embodiment during its manufacturing process.

Figure 16:
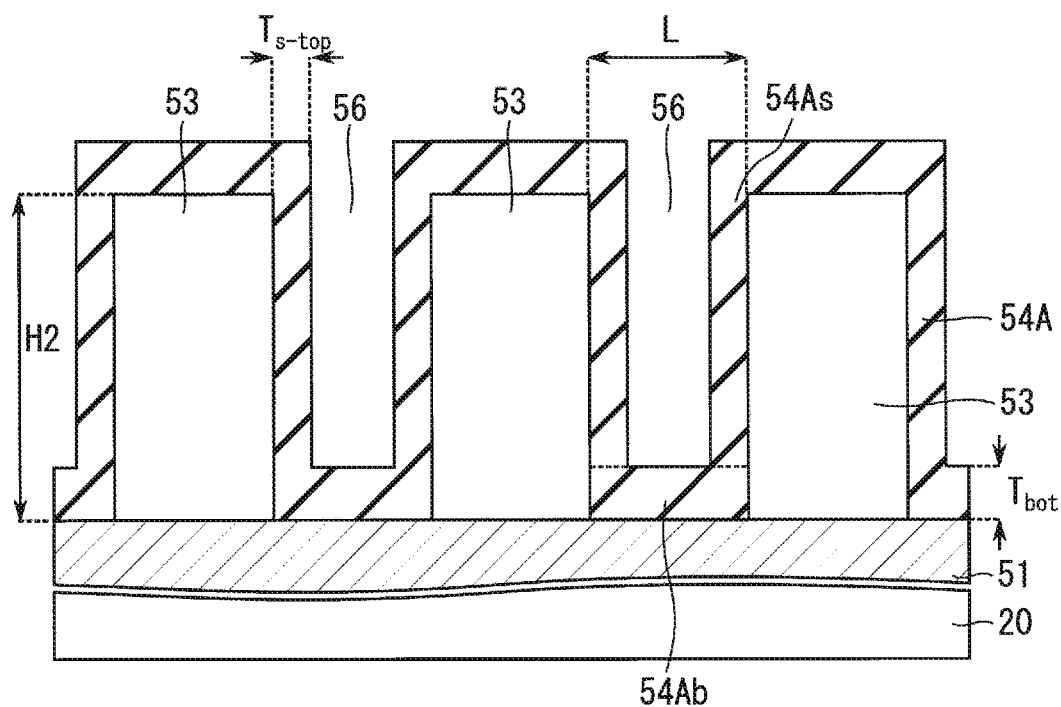
FIG. 16 shows a state of part of the memory device according to the second embodiment during its manufacturing process.

First, processes similar to those in FIGS. 5 to 7 in the first embodiment are performed. The only differences between those processes are the difference between the lower electrodes 21 and the conductor 51, and the difference between the layer stacks 24 and the layer stack 53. That is, as shown in FIG. 16, the conductor 51 is formed above the surface extending along the xy plane of the substrate 20. A layer stack 53A is formed on the upper surface of the conductor 51. The layer stack 53A includes layers of the same materials as those of the layers to be later processed into the layer stacks 53. According to the example shown in FIG. 15, the layer stack 53A includes a variable resistance material 36A, the buffer layer 31A, the ferromagnet 321A, the insulator 322A, the ferromagnet 323A, the cap layer 33A, and the hard mask 34A. The variable resistance material 36A includes the same material as that of the variable resistance material 36.

The layer stacks 53 are formed from the layer stack 53A by processes similar to those in FIGS. 6 and 7. An interval between the layer stacks 53 is L, as in the first embodiment. The inter-layer-stack areas 43 correspond to areas between the layer stacks 53. These areas are referred to as inter-layer-stack areas 56. At the point at which the layer stacks 53 have been formed by processes similar to those in FIG. 7, each of the inter-layer-stack areas 56 has an aspect ratio in excess of 1. That is, H2/L>1 is established.

As shown in FIG. 16, an insulator 54A is deposited on the whole upper surface of the structure obtained by the process described so far. The insulator 54A constitutes part of the inter-layer insulator 54 and includes one or more of SiO, SiN, AlN, and HfN, as in the inter-layer insulator 54, for example. The insulator 54A covers the surfaces (the upper surface and side surfaces) of the layer stacks 53 and the upper surfaces of portions of the conductor 51, which are located within the inter-layer-stack areas 56. The insulator 54A contains portions located on the upper surface of the conductor 51, and these portions may be referred to as bottoms 54Ab. The insulator 54A contains portions located on the side surfaces of the layer stacks 53, and these portions may be referred to as side wall tops 54As. The bottoms 54Ab of the insulator 54A have thickness Toot. The side wall tops 54As of the insulator 54A have thickness $T_{s\text{-}top}$.

Figure 17:
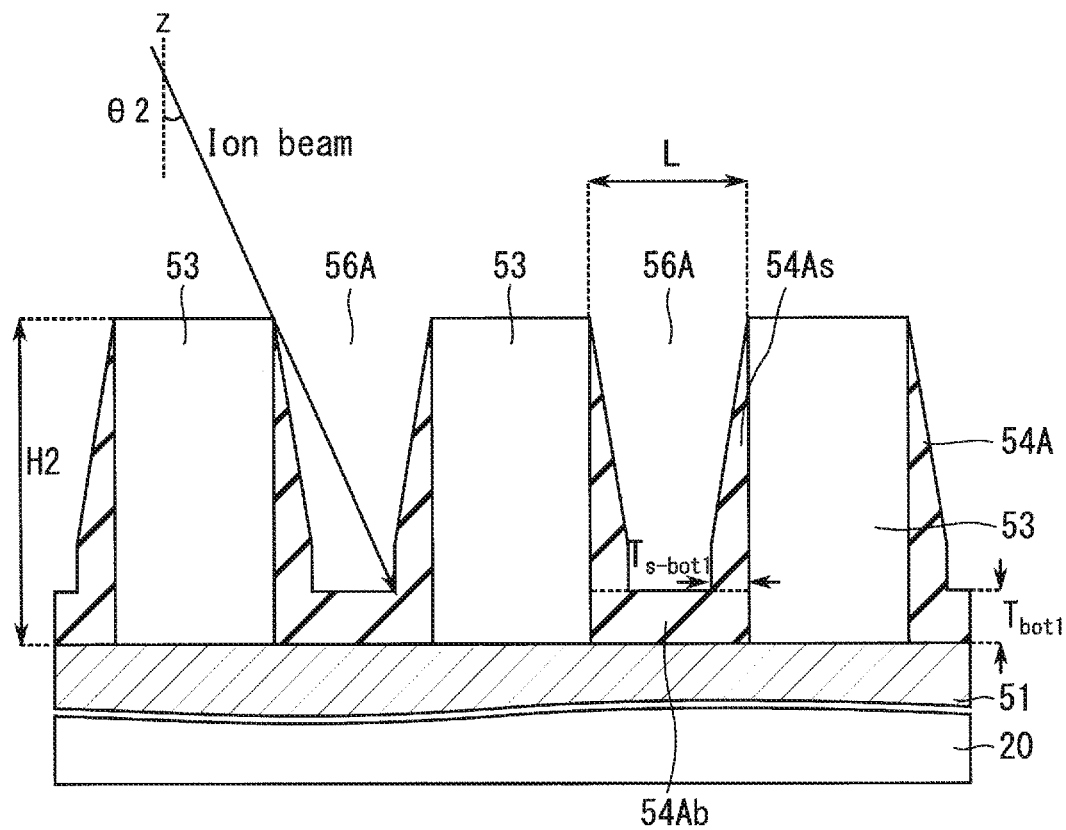
FIG. 17 shows a state subsequent to the state shown in FIG. 16.

As shown in FIG. 17, the insulator 54A is partially removed by IBE, in the same way as in FIG. 9. The IBE shown in FIG. 17 is the same as the IBE shown in FIG. 9 except for the angle of the ion beam.

Angle θ2 of ion beam satisfies the condition described as the following equation (2).

$$\theta 2 = \tan^{-1}\left(\frac{L - 2T_{s\text{-}bot1}}{H2 - T_{bot1}}\right) \quad (2)$$

Angle θ2 is an angle relative to the z axis, while thickness $T_{s\text{-}bot1}$ is a thickness of the side wall tops 54As of the insulator 54A, in particular, a thickness of the bottom portions of the side wall tops 54As. More specifically, thickness $T_{s\text{-}bot1}$ may be a thickness of the side wall tops 54As of the insulator 54A, at the same height as the height of the upper surfaces of the bottoms 54Ab of the insulator 54A, for example.

In the same way as in the IBE shown in FIG. 9 in the first embodiment, IBE exposes the upper surfaces of the layer stacks 53 with the ion beam, and makes the side wall tops 54As of the insulator 54A tapered. On the other hand, the bottoms of the side wall tops 54As of the insulator 54A maintain their original thickness (i.e., before IBE shown in FIG. 17), and this thickness is, for example, $T_{s\text{-}bot1}$. The bottoms 54Ab of the insulator 54A maintain their original thickness $T_{bot1}$ (i.e., before IBE shown in FIG. 17)

The inter-layer-stack areas 56 obtained as a result of the process in FIG. 17 contain areas free from the insulator 54A. Such areas are referred to as inter-layer-stack areas 56A. The inter-layer-stack areas 56A are smaller in volume than the inter-layer-stack areas 56 having height H2 and width L at the stage shown in FIG. 16, in the same way as the relation between the inter-layer-stack areas 43 and 43A in the first embodiment. In particular, since the insulator 54A with thickness $T_{bot1}$ remains in the bottoms of the inter-layer-stack areas 56, the inter-layer-stack areas 56A are smaller in aspect ratio than the inter-layer-stack areas 56. Furthermore, the upper ends of the inter-layer stack areas 56A have a larger width than that shown in FIG. 16, and, for example, width L.

As shown in FIG. 18, an insulator 54C is formed by depositing an insulator 54B on the whole upper surface of the structure obtained by the process described so far. The insulator 54B constitutes part of the inter-layer insulator 54 and includes one or more of SiO, SiN, AlN, and HfN, as does the inter-layer insulator 54, for example. The insulator 54B may be equal to or different from the insulator 54A in terms of property and/or composition. The insulator 54C contains portions located on the upper surface of the conductor 51, and these portions may be referred to as bottoms 54Cb. The insulator 54C contains portions located on the side surfaces of the layer stacks 53, and these portions may be referred to as side wall tops 54Cs. The bottoms 54Cb of the insulator 54C have thickness $T_{bot2}$.

As shown in FIG. 19, the insulator 54C is partially removed by IBE, in the same way as in FIGS. 9 and 17. The IBE shown in FIG. 19 is the same as the IBE shown in FIGS. 9 and 17 except for the angle of the ion beam.

Angle θ3 of ion beam satisfies the condition described as the following equation (3).

$$\theta 3 = \tan^{-1}\left(\frac{L - 2T_{s\text{-}bot2}}{H2 - T_{bot2}}\right) \quad (3)$$

Angle θ3 is an angle relative to the z axis, while thickness $T_{s\text{-}bot2}$ is a thickness of the lower ends of the side wall tops 54Cs of the insulator 54C. More specifically, thickness $T_{s\text{-}bot2}$ may be a thickness of the side wall tops 54Cs of the insulator 54C, at the same height as the height of the upper surfaces of the bottoms 54Cb of the insulator 54C, for example.

In the same way as the IBE shown in FIGS. 9 and 17, IBE exposes the upper surfaces of the layer stacks 53 with the ion beam, and makes the side wall tops 54Cs of the insulator 54C tapered. On the other hand, the bottoms of the side wall tops 54Cs of the insulator 54C maintain their original thickness (i.e., before IBE shown in FIG. 19), and this thickness is, for example, $T_{s\text{-}bot2}$. The bottoms 54Cb of the insulator 54C maintain their original thickness $T_{bot2}$ (i.e., before IBE shown in FIG. 19).

The inter-layer-stack areas 56A obtained as a result of the process in FIG. 19 contain areas free from the insulator 54C. Such areas are referred to as inter-layer-stack areas 56B. The inter-layer-stack areas 56B are smaller in volume than the inter-layer-stack areas 56A before IBE, shown in FIG. 18. In particular, since the insulator 54C with thickness $T_{bot2}$ remains in the bottoms of the inter-layer-stack areas 56B, the inter-layer-stack areas 56B are smaller in aspect ratio than the inter-layer-stack areas 56A. Furthermore, the upper ends of the inter-layer-stack areas 56B have a larger width than that shown in FIG. 18, and, for example, width L.

Figure 20:
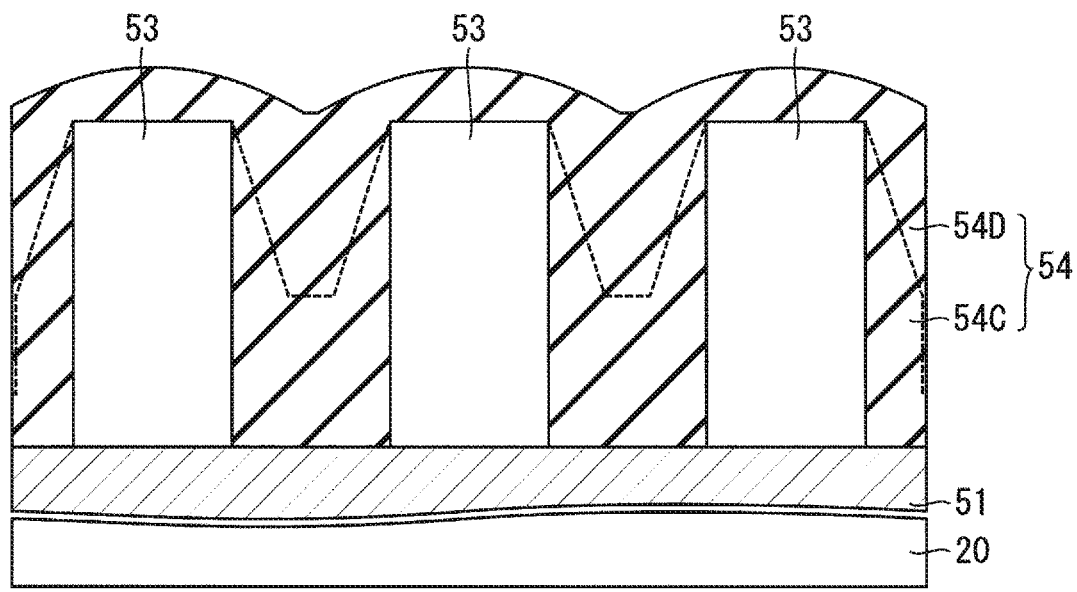
FIG. 20 shows a state subsequent to the state shown in FIG. 19.

As shown in FIG. 20, an insulator 54D is deposited on the whole upper surface of the structure obtained by the process described so far. The insulator 54D constitutes part of the inter-layer insulator 54 and includes one or more of SiO, SiN, AlN, and HfN, as does the inter-layer insulator 54, for example. The insulator 54D may be equal to or different from the insulator 54A and 54B in terms of property and/or composition.

As shown in FIG. 14, the inter-layer insulator 57 is formed on the upper surface of the inter-layer insulator 54, and the conductors 58 are formed.

Regarding stacking of an insulator and partial removal of the insulator by etching with angled ion beam, the same pair of stacking and partial removal processes as shown in FIGS. 16 and 17 or FIGS. 18 and 19 may be repeated more than two times.

2.3. Advantages

According to the second embodiment, the insulator 54A is deposited on the surfaces of the layer stacks 53, and then the bottoms 54Ab of the insulator 54A are maintained while the side wall tops 54As of the insulator 54A are partially etched utilizing a shadow effect by IBE, as in the first embodiment. Thus, the second embodiment offers the same advantages as those in the first embodiment. Furthermore, according to the second embodiment, both stacking of an insulator and removal of portions on the side walls of the layer stacks 53 while maintaining the bottoms of the stacked insulator are repeatedly performed. Therefore, even with the structure having the higher layer stacks 53, the inter-layer insulator 54 can be filled well in the gaps between the layer stacks 53, as in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a memory device, the method comprising:
   forming a first layer stack and a second layer stack at an interval on a foundation;
   forming a first insulator that includes a first portion on a side surface of the first layer stack, a second portion on a side surface of the second layer stack, and a third portion on the foundation between the first layer stack and the second layer stack;
   thinning part of the first portion of the first insulator and part of the second portion of the first insulator with an ion beam while leaving the third portion of the first insulator, before a material other than the first insulator is formed between the first layer stack and the second layer stack; and
   forming a second insulator between the first portion of the first insulator and the second portion of the first insulator.

2. The method according to claim 1, wherein:
   the second insulator includes a first portion having a first surface and a second surface facing the first surface;
   the first surface is in contact with the first portion of the first insulator; and
   the second surface is in contact with the second portion of the first insulator.

3. The method according to claim 1, wherein:
   the forming of the second insulator includes filling an area between the first portion of the first insulator and the second portion of the first insulator with the second insulator.

4. The method according to claim 1, wherein:
the first layer stack or the second layer stack includes an element that exhibits a magnetoresistive effect.

5. The method according to claim 4, wherein:
the first layer stack or the second layer stack further includes a bidirectional switching element.

6. The method according to claim 1, wherein:
the part of the first portion of the first insulator is a portion on an upper side of the first portion of the first insulator; and
the part of the second portion of the first insulator is a portion on an upper side of the second portion of the first insulator.

7. The method according to claim 1, wherein:
the thinning of the first portion of the first insulator and the second portion of the first insulator includes emitting the ion beam at a first angle relative to a direction in which the side surface of the first layer stack or the side surface of the second layer stack extends.

8. The method according to claim 7, wherein:
the first layer stack or the second layer stack further includes a bidirectional switching element.

9. The method according to claim 7, wherein:
the first angle is $\theta$;

$$\theta = \tan^{-1}\left(\frac{L - 2T_{s-bot}}{H - T_{bot}}\right)$$

where:

L is a length of the interval between the first layer stack and the second layer stack;

$T_{s\text{-}bot}$ is a thickness of the part of the first portion of the first insulator or the part of the second portion of the first insulator before being thinned;

H is a height of the first layer stack or the second layer stack; and $T_{bot}$ is a thickness of the third portion of the first insulator.

10. The method according to claim 1, wherein:

$H/L > 1$ is satisfied;

where:

H is a height of the first layer stack or the second layer stack; and

L is a length of the interval between the first layer stack and the second layer stack.

11. The method according to claim 1, wherein:

the thinning of the part of the first portion of the first insulator and the second portion of the first insulator includes making the part of the first portion of the first insulator thin gradually toward a top of the first layer stack and making the part of the second portion of the first insulator thin gradually toward a top of the second layer stack.

* * * * *